US009685604B2

(12) United States Patent
Huang et al.

(10) Patent No.: US 9,685,604 B2
(45) Date of Patent: Jun. 20, 2017

(54) MAGNETORESISTIVE RANDOM ACCESS MEMORY CELL AND FABRICATING THE SAME

(71) Applicant: Taiwan Semiconductor Manufacturing Company, Ltd., Hsin-Chu (TW)

(72) Inventors: Wei-Hang Huang, Kaohsiung (TW); Shih-Chang Liu, Kaohsiung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/841,311

(22) Filed: Aug. 31, 2015

(65) Prior Publication Data

US 2017/0062699 A1     Mar. 2, 2017

(51) Int. Cl.
| | |
|---|---|
| *H01L 43/08* | (2006.01) |
| *H01L 43/12* | (2006.01) |
| *H01L 27/22* | (2006.01) |
| *G11C 11/15* | (2006.01) |
| *H01L 43/02* | (2006.01) |
| *H01L 43/10* | (2006.01) |
| *G11C 11/16* | (2006.01) |

(52) U.S. Cl.
CPC .............. *H01L 43/02* (2013.01); *G11C 11/15* (2013.01); *G11C 11/161* (2013.01); *H01L 27/222* (2013.01); *H01L 43/08* (2013.01); *H01L 43/10* (2013.01); *H01L 43/12* (2013.01)

(58) Field of Classification Search
CPC ..... G11C 11/161; G11C 11/15; H01L 27/222; H01L 43/08; H01L 43/12
See application file for complete search history.

(56) References Cited

U.S. PATENT DOCUMENTS

| | | | | |
|---|---|---|---|---|
| 6,358,756 | B1 * | 3/2002 | Sandhu ................. | B82Y 10/00 257/E21.665 |
| 6,743,642 | B2 * | 6/2004 | Costrini ................ | B82Y 25/00 257/E27.005 |
| 6,965,138 | B2 * | 11/2005 | Nakajima ............. | B82Y 10/00 257/295 |
| 7,594,198 | B2 | 9/2009 | Chen | |
| 7,595,520 | B2 * | 9/2009 | Horng ................... | B82Y 25/00 257/295 |
| 7,602,033 | B2 * | 10/2009 | Zhao ..................... | B82Y 10/00 257/427 |
| 7,645,618 | B2 * | 1/2010 | Ditizio .................. | H01L 43/12 257/71 |

(Continued)

*Primary Examiner* — Evan Pert
(74) *Attorney, Agent, or Firm* — Haynes and Boone, LLP

(57) ABSTRACT

A magnetoresistive random-access memory (MRAM) cell includes a free layer having a variable magnetic polarity, wherein the free layer has a first width; a pin layer having a fixed magnetic polarity, wherein the pin layer has the first width; a barrier layer located between the pin layer and the free layer, wherein the barrier layer has a second width that is less than the first width; a top electrode layer located above the free layer, the pin layer, and the barrier layer; a bottom electrode layer located beneath the free layer, the pin layer, and the barrier layer; and a capping layer encapsulating a sidewall of the barrier layer.

20 Claims, 12 Drawing Sheets

(56) References Cited

U.S. PATENT DOCUMENTS

| | | | |
|---|---|---|---|
| 7,955,870 B2* | 6/2011 | Ditizio | C07D 401/04 257/298 |
| 8,119,424 B2* | 2/2012 | Mather | B82Y 10/00 257/E21.665 |
| 8,310,861 B2* | 11/2012 | Liu | G11C 11/16 257/421 |
| 8,324,658 B2 | 12/2012 | Tsai et al. | |
| 8,334,571 B2 | 12/2012 | Tsai et al. | |
| 8,541,848 B2 | 9/2013 | Huang et al. | |
| 8,593,854 B1 | 11/2013 | Chih et al. | |
| 8,605,523 B2 | 12/2013 | Tao et al. | |
| 8,630,132 B2 | 1/2014 | Cheng et al. | |
| 8,685,756 B2* | 4/2014 | Aggarwal | H01L 43/12 257/E21.665 |
| 8,730,626 B2 | 5/2014 | Tseng et al. | |
| 8,743,515 B2 | 6/2014 | Yang et al. | |
| 8,759,871 B2 | 6/2014 | Song et al. | |
| 8,760,828 B2 | 6/2014 | Ma | |
| 8,760,948 B2 | 6/2014 | Tao et al. | |
| 8,792,218 B2 | 7/2014 | Tsai | |
| 8,854,778 B2 | 10/2014 | Chu et al. | |
| 8,867,183 B2 | 10/2014 | Chen et al. | |
| 8,869,436 B2 | 10/2014 | Tsai et al. | |
| 9,166,146 B2* | 10/2015 | Wang | H01L 43/08 |
| 9,218,863 B2* | 12/2015 | Liu | G11C 11/16 |
| 9,230,627 B2* | 1/2016 | Wu | G11C 11/161 |
| 9,305,628 B2* | 4/2016 | Stainer | H01F 10/3254 |
| 9,331,268 B2* | 5/2016 | Prejbeanu | H01L 43/08 |
| 9,406,875 B2* | 8/2016 | Li | G11C 11/161 |
| 2013/0093052 A1 | 4/2013 | Ma et al. | |
| 2013/0119433 A1 | 5/2013 | Wang | |
| 2013/0170080 A1 | 7/2013 | Chen | |
| 2013/0234094 A1 | 9/2013 | Chang et al. | |
| 2013/0336041 A1 | 12/2013 | Tsai et al. | |
| 2013/0342941 A1 | 12/2013 | Wang et al. | |
| 2014/0032871 A1 | 1/2014 | Hsu et al. | |
| 2014/0118869 A1 | 5/2014 | Meng et al. | |
| 2014/0146593 A1 | 5/2014 | Tsai et al. | |
| 2014/0153321 A1 | 6/2014 | Liaw | |
| 2014/0153345 A1 | 6/2014 | Kim et al. | |
| 2014/0166961 A1 | 6/2014 | Liao et al. | |
| 2014/0175365 A1 | 6/2014 | Chang et al. | |
| 2014/0175611 A1 | 6/2014 | Hsu | |
| 2014/0177352 A1 | 6/2014 | Lum | |
| 2014/0183518 A1 | 7/2014 | Tsai et al. | |
| 2014/0203236 A1 | 7/2014 | Chen et al. | |
| 2014/0210014 A1 | 7/2014 | Ma et al. | |
| 2014/0217461 A1 | 8/2014 | Song et al. | |
| 2014/0226241 A1 | 8/2014 | Tseng et al. | |
| 2014/0233330 A1 | 8/2014 | Ko et al. | |
| 2014/0241077 A1 | 8/2014 | Katoch et al. | |
| 2014/0264222 A1 | 9/2014 | Yang et al. | |
| 2014/0264233 A1 | 9/2014 | Tu et al. | |
| 2014/0269114 A1 | 9/2014 | Yang et al. | |
| 2014/0307355 A1 | 10/2014 | Tsai et al. | |
| 2015/0380640 A1* | 12/2015 | Deshpande | G11B 5/84 438/3 |
| 2016/0149123 A1* | 5/2016 | Park | H01J 37/32357 438/3 |

* cited by examiner

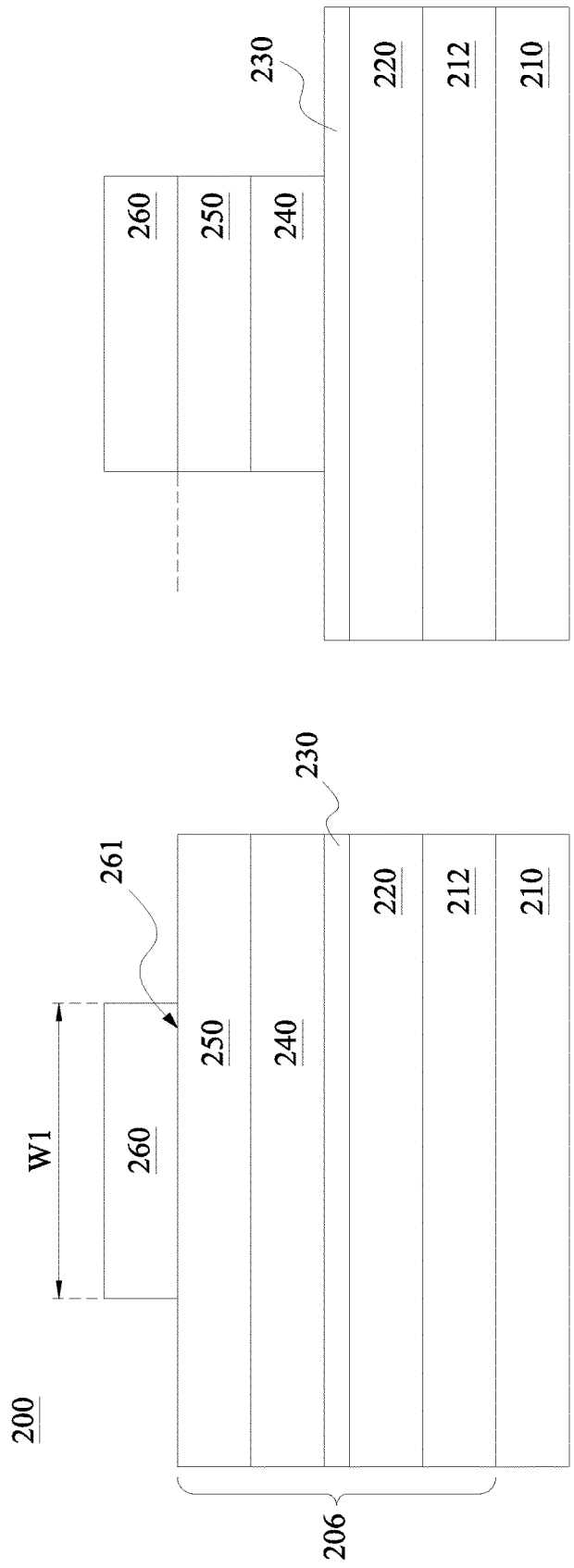

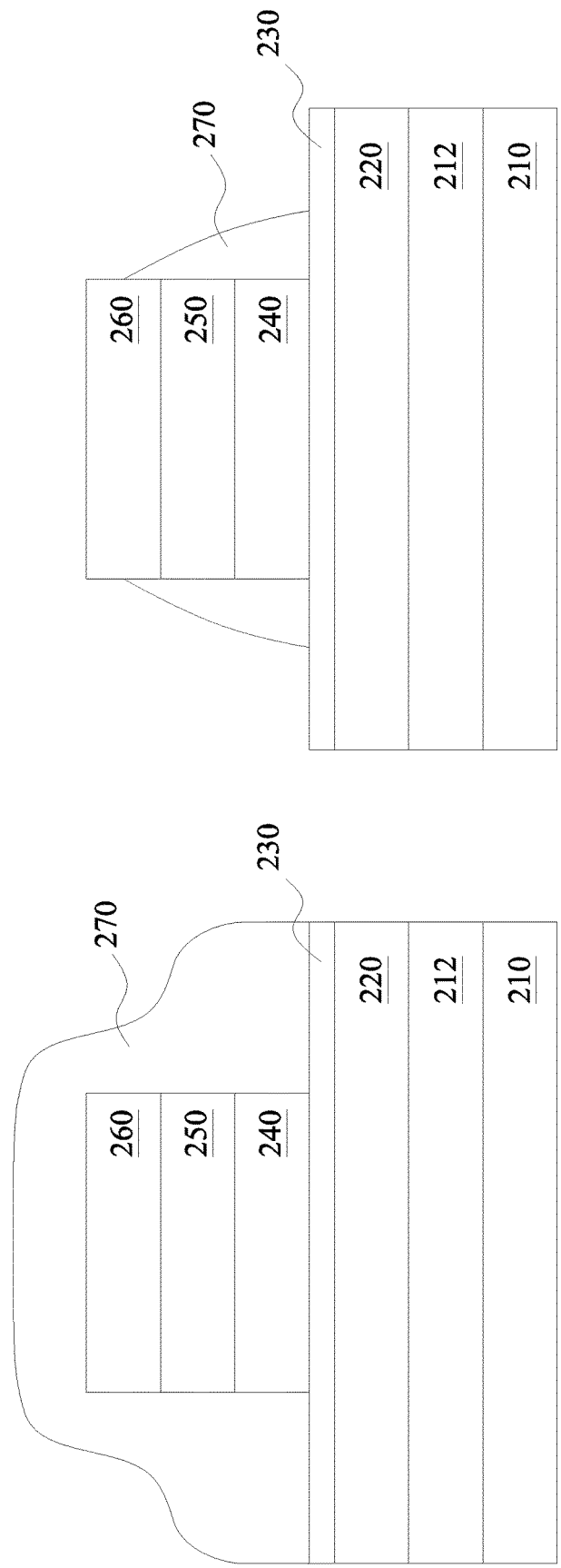

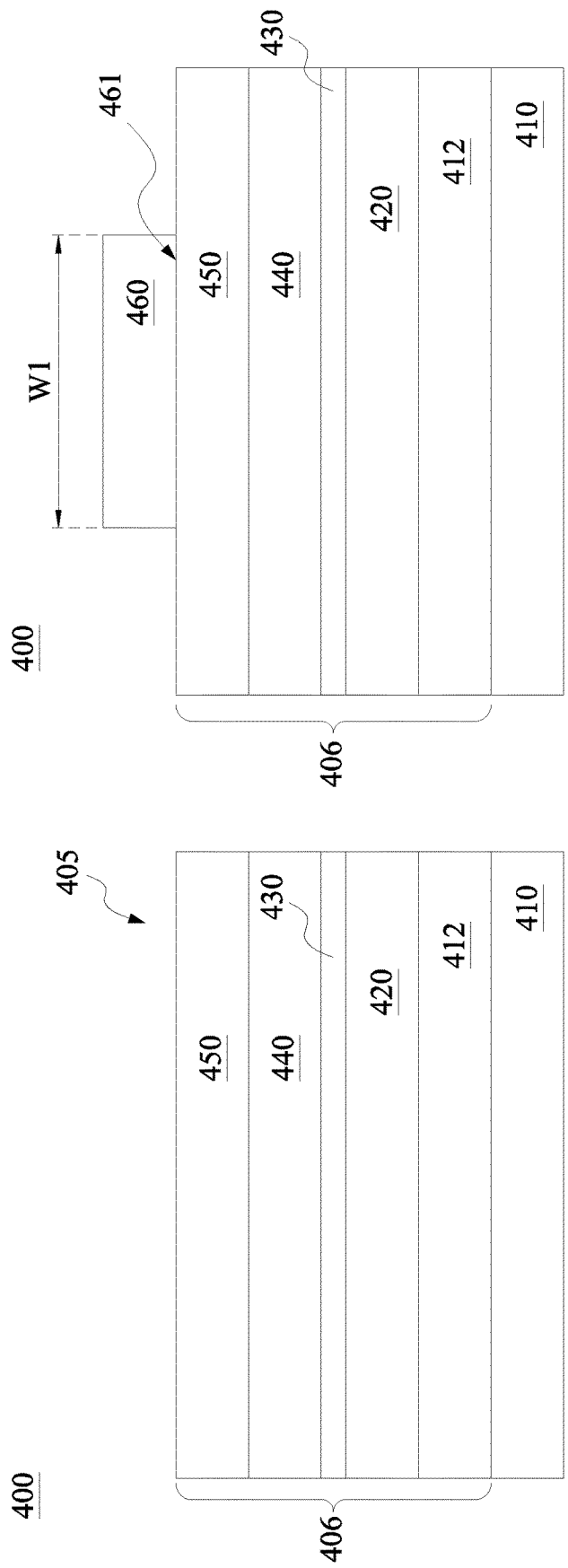

MAGNETORESISTIVE RANDOM ACCESS MEMORY CELL AND FABRICATING THE SAME

BACKGROUND

In integrated circuit (IC) devices, magnetoresistive random access memory (MRAM) is an emerging technology for next generation embedded memory devices. MRAM is a memory device including an array of MRAM cells, each of which stores a bit of data using resistance values, rather than electronic charge. Each MRAM cell includes a magnetic tunnel junction ("MTJ") cell, the resistance of which can be adjusted to represent logic "0" or logic "1". The MTJ includes a stack of films. The MTJ cell is coupled between top and bottom electrodes and an electric current flowing through the MTJ cell from one electrode to the other may be detected to determine the resistance, and therefore the logic state. During fabrication of an MTJ cell, various damages may occur to the MTJ cell, including damage to the sidewalls of the stack of films comprising the MTJ cell from various etching processes. This etching induced damage results in decreased performance of the MTJ cell such as for example, leakage current. Accordingly, it would be desirable to provide an improved MRAM structure and method of manufacturing thereof.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 2A, 2B, 2C, 2D, 2E, 2F, 2G, 2H, and 2I are cross-sectional views of a MRAM cell fabricated by the method of FIG. 1 in accordance with some embodiments.

FIGS. 4A, 4B, 4C, 4D, 4E, 4F, 4G, 4H, 4I, and 4J are cross-sectional views of an exemplary MRAM cell fabricated by the method of FIG. 3 in accordance with some embodiments.

DETAILED DESCRIPTION

Figure 1:
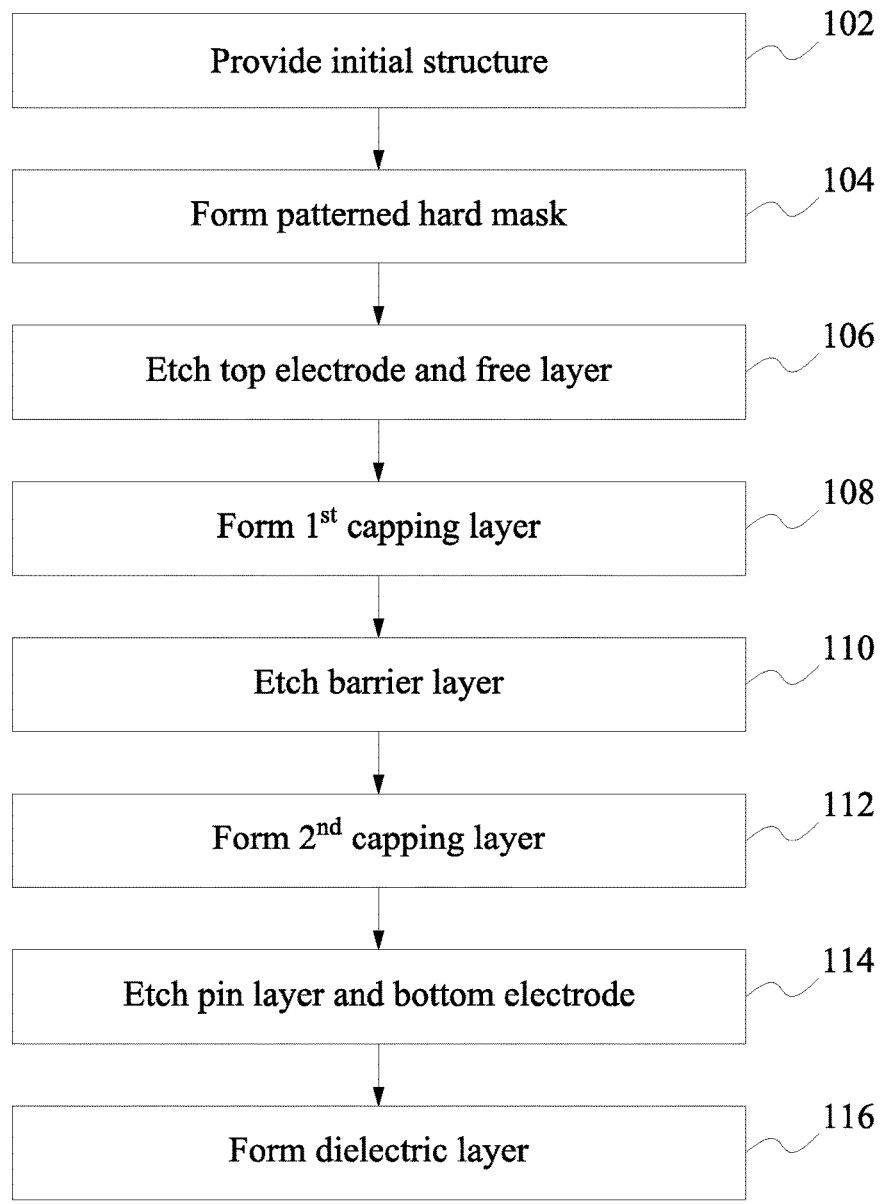
FIG. 1 is a flowchart of an example method for fabricating a MRAM cell constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A MRAM cell includes a pair of electrode layers and a magnetic tunneling junction (MTJ) arranged between the electrode layers. The MTJ includes a pair of ferromagnetic layers, and a barrier layer arranged between the ferromagnetic layers. The ferromagnetic layers include a pin layer and a free layer. The pin layer has a permanent or fixed magnetic polarity, typically pinned by an anti-ferromagnetic layer arranged between one of the electrode layers and the pin layer. The free layer has a variable magnetic polarity representing a unit of data, such as a bit of data.

In an operation, the variable magnetic polarity is typically read by measuring the resistance of the MTJ. Due to the magnetic tunnel effect, the resistance of the MTJ changes with the variable magnetic polarity. Further, in operation, the variable magnetic polarity is typically changed or toggled using the spin-transfer torque (STT) effect. According to the spin-transfer torque (STT) effect, current is passed across the MTJ to induce a flow of electrons from the pin layer to the free layer. As electrons pass through the pin layer, the spins of the electrons are polarized. When the spin-polarized electrons reach the free layer, the spin-polarized electrons apply a torque to the variable magnetic polarity and toggle the state of the variable magnetic polarity.

According to some methods for manufacturing a MRAM cell, a free layer, a barrier layer, a pin layer and an anti-ferromagnetic layer are stacked in that order over a bottom electrode layer. One or more plasma etches are then performed to the bottom electrode layer through regions of the anti-ferromagnetic layer, the pin layer, the barrier layer and the free layer surrounding a MTJ region of the stack. During these etch processes, one or more of the layers forming the MTJ may experience process-induced adverse effects, such as plasma damage, and/or by-products re-deposition, which leads to increased leakage current and/or reduced data retention. In the present embodiment, methods 100 and 300 described below provide schemes of preventing etch-process-induced damage.

Referring now to FIG. 1, a flowchart of a method 100 of fabricating one or more MRAM cells in accordance with some embodiments is illustrated. The method 100 is discussed in detail below, with reference to a MRAM cell 200 shown in FIGS. 2A, 2B, 2C, 2D, 2E, 2F, 2G, 2H, and 2I. FIGS. 2A-2I illustrate sectional views of the MRAM cell 200 during various fabrication stages and constructed according to various aspects of the present disclosure in one or more embodiments.

Figure 2A:
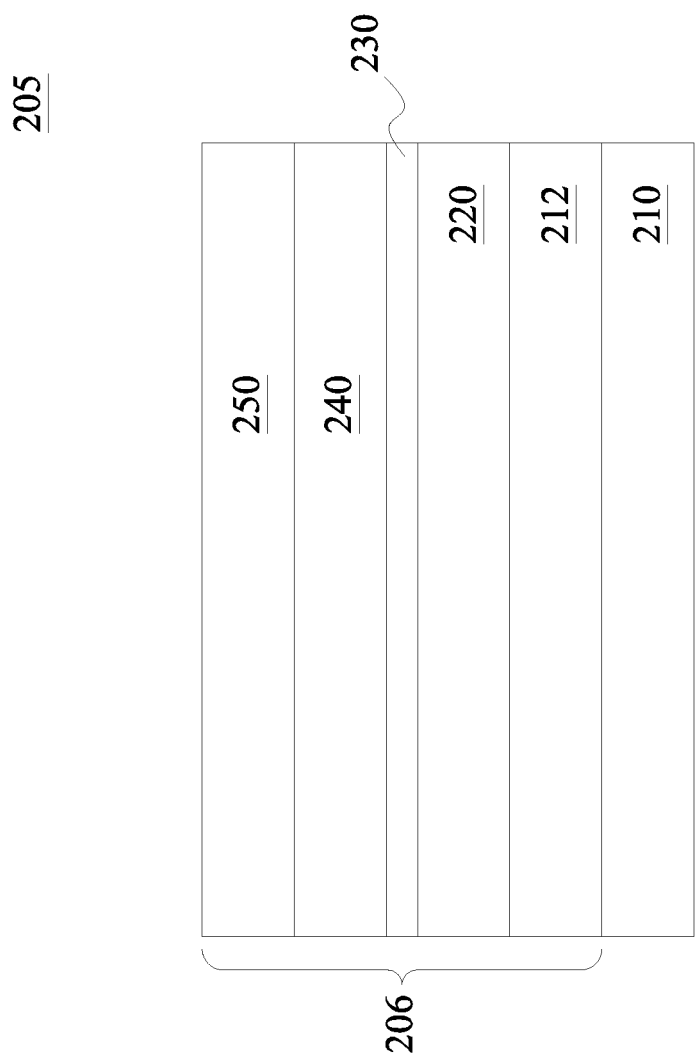

The method 100 starts at operation 102 by providing an initial structure 205 of a MRAM cell 200 as shown in FIG. 2A. The initial structure 205 includes a bottom electrode layer 212 disposed over a substrate 210. The substrate 210 may include layers, features of an integrated circuit, such as an etch-stop layer and vias. The bottom electrode layer 212 may include titanium (Ti), tantalum (Ta), platinum (Pt), ruthenium (Ru), titanium nitride (TiN), tantalum nitride (TaN), and/or other suitable materials. In one embodiment, the bottom electrode layer 212 has a thickness ranging from about 10 nm to about 100 nm.

The initial structure 205 also includes a stack of films 206 over the bottom electrode layer 212. The stack of films 206 includes a pin layer 220 disposed over the bottom electrode layer 212. The pin layer 220 may include a ferromagnetic material such as Co, Fe, CoFeBRu, CoFeTa, CoFeB, NiFe, Co, CoFe, CoPt, CoPd, FePt, and/or the alloy of Ni, Co and/or Fe. In one embodiment, the pin layer 220 has a thickness ranging from about 5 nm to about 10 nm. Additionally or alternatively, the pin layer 220 may also include a multilayer structure. In the example where the pin layer 220 includes a multilayer structure, the pin layer 220 may include a first pinned layer (or bottom pin layer) and a second pinned layer (or top pin layer) interposed by a spacer layer.

The stack of films 206 also includes a barrier layer 230 disposed over the pin layer 220. The barrier layer 230 provides electrical isolation between the pin layer 220 and a free layer 240 to be formed over the barrier layer 230, while still allowing electrons to tunnel through under proper conditions. The material of the barrier layer 230 is also chosen in such that it has an adequate etching resistance in a subsequent etching which will be described details later. The barrier layer 230 may include a metal-oxide and/or metal-nitride layer. The metal in the metal-oxide (or metal-nitride) barrier layer includes magnesium (Mg), beryllium (Be), aluminium (Al), Ti, tungsten (W), germanium (Ge), Pt and/or their alloy. In one embodiment, the barrier layer 230 has a thickness ranging from about 0.5 nm to about 2 nm.

The free layer 240 may include a ferromagnetic material but it is not pinned because there is no anti-ferromagnetic material adjacent to the free layer 240. Therefore, the magnetic orientation of the layer 240 is free, thus referred to as a free layer. The free layer 240 has a variable magnetic polarity representing a unit of data. For example, the variable magnetic polarity switches between a first state and a second state that respectively represent a binary "0" and a binary "1". The free layer 240 may include cobalt (Co), iron (Fe), boron cobalt-iron-boron (CoFeB), cobalt-iron-tantalum (CoFeTa), nickel iron (NiFe), cobalt iron (CoFe), cobalt platinum (CoPt), cobalt palladium (CoPd), iron platinum (FePt), and/or the alloy of Ni, Co and/or Fe. In one embodiment, the free layer 240 has a thickness ranging from about 1 nm to about 3 nm.

The stack of films 206 also includes a top electrode layer 250 disposed over the free layer 240. The top electrode layer 250 may include titanium (Ti), tantalum (Ta), platinum (Pt), ruthenium (Ru), titanium nitride (TiN), tantalum nitride (TaN), and/or other suitable materials. In one embodiment, the top electrode layer 250 has a thickness ranging from about 10 nm to about 100 nm.

One or more of layers 212, 220, 230, 240 and 250 may be formed by various methods, including physical vapor deposition (PVD) process, a chemical vapor deposition (CVD) process, ion beam deposition, spin-on coating, metal-organic decomposition (MOD), atomic layer deposition (ALD), and/or other suitable methods.

Referring to FIGS. 1 and 2B, after the initial structure 205 is provided, the method 100 proceeds to operation 104 by forming a patterned hard mask (HM) layer 260 over the top electrode layer 250. The patterned HM layer 260 defines (covers) a MTJ region 261 having a first width $W_1$. In one embodiment, the patterned HM 260 is a patterned photoresist layer formed by a procedure including coating, exposure, post exposure baking, and developing. In another embodiment, the patterned HM 260 is formed by depositing a HM layer over the top electrode layer 250, depositing photoresist layer over the HM layer, patterning the photoresist layer, then etching the HM layer through patterned photoresist layer to pattern the HM layer. The HM layer may include oxide, silicon nitride, and/or other suitable material, deposited by CVD, PVD, spin-on coating, and/or other suitable technique.

Referring to FIGS. 1 and 2C, the method 100 proceeds to operation 106 by performing a first etch process to etch the top electrode 250 and the free layer 240 by using the patterned HM layer 260 as an etch mask. The first etch process may include a wet etch, a dry etch, and/or a combination thereof. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The first etch process may include a multiple-step etching to gain etch selectivity, flexibility and desired etch profile. As has been mentioned previously, the first etch process is chosen to selectively etch the top electrode layer 250 and the free layer 240 without substantially etching the barrier layer 230. Thus, the barrier layer 230 may serve as an etch-stop layer to alleviate etch process constraints and improve the etch process window.

Referring to FIGS. 1 and 2D, the method 100 proceeds to operation 108 by forming a first capping layer 270 over the patterned HM layer 260, including conformably extending along sidewalls of the top electrode layer 250 and the free layer 240. The first capping layer 270 may include silicon nitride, silicon carbide, and/or other suitable materials. The material of the first capping layer 270 is chosen in such that it has an adequate etching resistance in a subsequent etching as described below. The first capping layer 270 may be deposited by CVD, ALD, and/or other suitable process.

Referring to FIGS. 1 and 2E, during the operation 108 of method 100, a second etch process is performed to remove part of the first capping layer 270 to expose a top surface of the barrier layer 230 and to expose a top surface of patterned HM 260. After the second etching, etched first capping layer 270' is formed and the etched capping layer 270' remains along sidewalls of the top electrode layer 250 and the free layer 240. In some alternative embodiments, the etched first capping layer 270' may extend to the sidewall of the patterned HM 260. In the present embodiment, the second etch process may include an anisotropic dry etch process, which etches the first capping layer 270 disposed over the top surface the barrier layer 230 but leaves the portion of the capping layer 270 along the sidewalls of the top electrode layer 250 and the free layer 240 (i.e., 270'). The second etch process may also include a selective anisotropic dry etch process, which is preferential of the first capping layer 270 relative to the patterned HM 260 and the barrier layer 230. In one embodiment, the second etch process includes a plasma dry etching process using a fluorine-based chemistry, such as $CF_4$, $SF_6$, $CH_2F_2$, $CHF_3$, and/or $C_2F_6$.

Figure 2G:
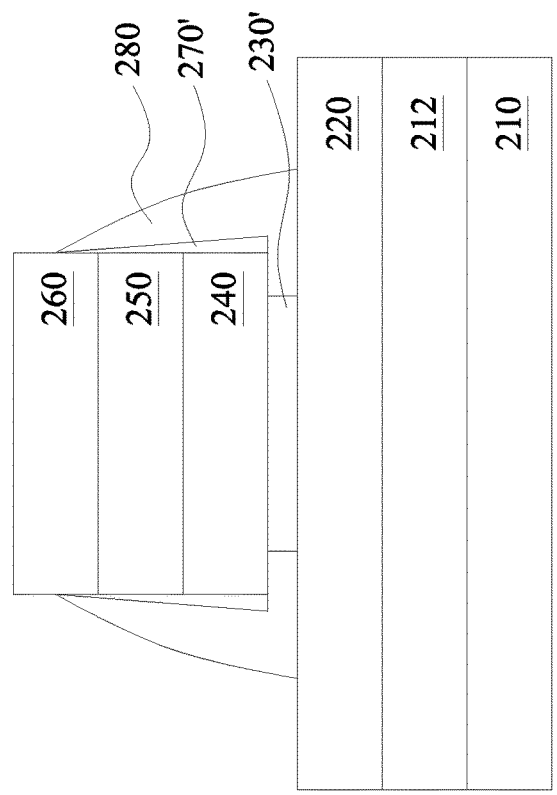
Figure 2F:
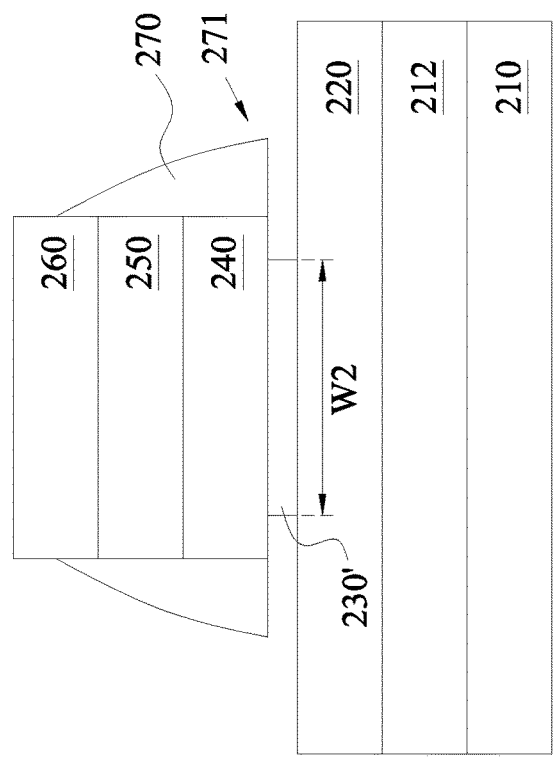

Referring to FIGS. 1 and 2F, the method 100 proceeds to step 110 of performing a third etch process 271 to etch the exposed portions of barrier layer 230 thereby forming an etched barrier layer 230' (or recessed barrier layer). As shown in FIG. 2F, a recess is formed respectively on left and right sides of the etched barrier layer 230'. The etched (remaining) barrier layer 230' has a width $W_2$, which is narrower than the width of the patterned HM 260, the free layer 240, and the top electrode layer 250 (i.e., $W_1$). In accordance with the current embodiments, the width $W_2$ is about 90% the width $W_1$. More specifically, the recess formed on the left/right side of the etched barrier layer 230' may has a width about 5% the width of the patterned HM 260, the free layer 240, and the top electrode layer 250 (i.e., $W_1$). The third etch process may include a wet etch, a dry etch, and/or a combination thereof. In the present embodiment, the third etch is an isotropic etch process. Moreover, the third etch process is chosen to selectively etch the barrier layer 230 without substantially etching the patterned HM 260 and the etched first capping layer 270'. Thus, the etched first capping layer 270' advantageously protects the sidewalls of the top electrode layer 250 and the free layer 240 during the third etch process. This reduces the likelihood of damage, and/or the re-deposition of by-product on the sidewalls of the top electrode layer 250 and the free layer 240. As described above, such damage and/or re-deposition leads to increased leakage current and/or reduced data retention in a memory cell.

Still referring to FIG. 2F, the third etch process may be a plasma-assisted etch process. Such a plasma-assisted etching process may use methanol at flow rate of about 100 standard cubic centimeters per minute (sccm). More specifically, during the etch process, a source power of about 1500 Watt to about 2000 Watt may be used while no bias power is provided. By not applying any bias power, it advantageously causes the third etch process to be more isotropic and thus may etch the barrier layer 230 in a more controllable manner.

Referring to FIGS. 1 and 2G, the method 100 proceeds to operation 112 of forming a second capping layer 280 over the etched first capping layer 270' and filling the recess beside the etched barrier layer 230', including conformably extending along the sidewalls of the top electrode layer 250, the free layer 240, and the etched barrier layer 230'. The second capping layer 280 is formed similarly in many respects with the first capping layer 270/270' discussed above with respect to FIGS. 2D and 2E. In that regard, second capping layer 280 may be formed of the same materials or different materials than first capping layer 270/270'.

Figure 2I:
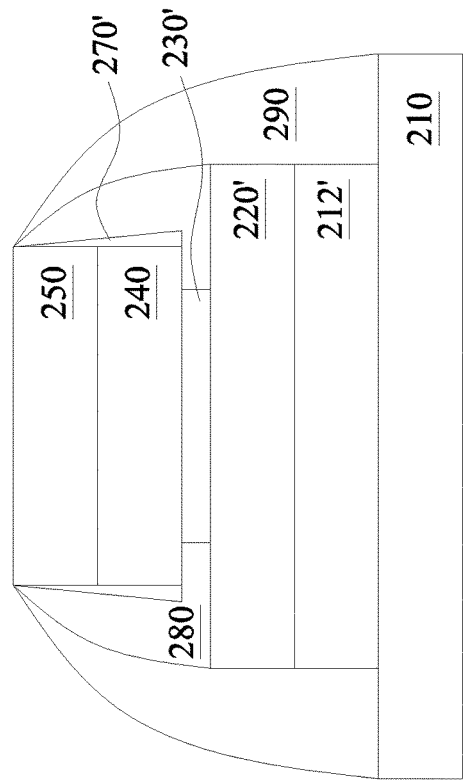
Figure 2H:
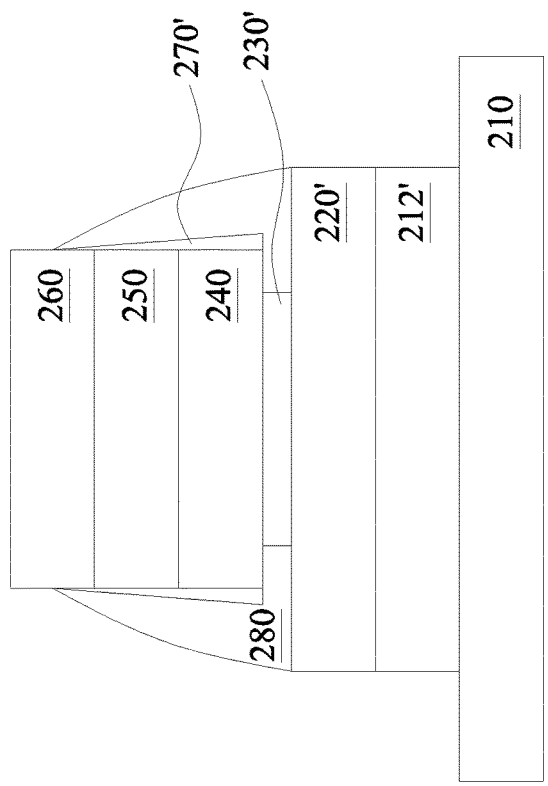

Referring to FIGS. 1 and 2H, the method 100 proceeds to operation 114 by etching the pin layer 220 and the bottom electrode layer 212 by using the second capping layer 280 as an etch mask. As shown in the illustrated embodiment of FIG. 2H, the pin layer 220 and the bottom electrode layer 212 are etched to form etched pin layer 220' and etched bottom electrode layer 212', respectively. Since the second capping layer 280 is used as the etch mask and the formed pin layer 220' and the bottom electrode layer 212' are formed according to the etch mask without a further pattering process, the operation may be referred to as a "self-aligning" process.

Referring to FIGS. 1 and 2I, the method 100 proceeds to operation 116 by forming a dielectric layer 290 over the second capping layer 280 and filling up spaces around the MTJ region. In some embodiments, the dielectric layer 290 may be an inter-metal dielectric layer and/or an inter-layer dielectric layer. Such an dielectric layer 290 may include silicon oxide, silicon nitride, a dielectric material layer having a dielectric constant (k) lower than thermal silicon oxide (therefore referred to as low-k dielectric material layer), and/or other suitable dielectric material layer. The dielectric layer 290 may be deposited by CVD, spin-on coating, and/or other suitable process. In some specific embodiments, the forming the dielectric layer 290 may further include performing a chemical mechanical polishing/planarization (CMP) process thereby removing the patterned HM 260.

Figure 3:
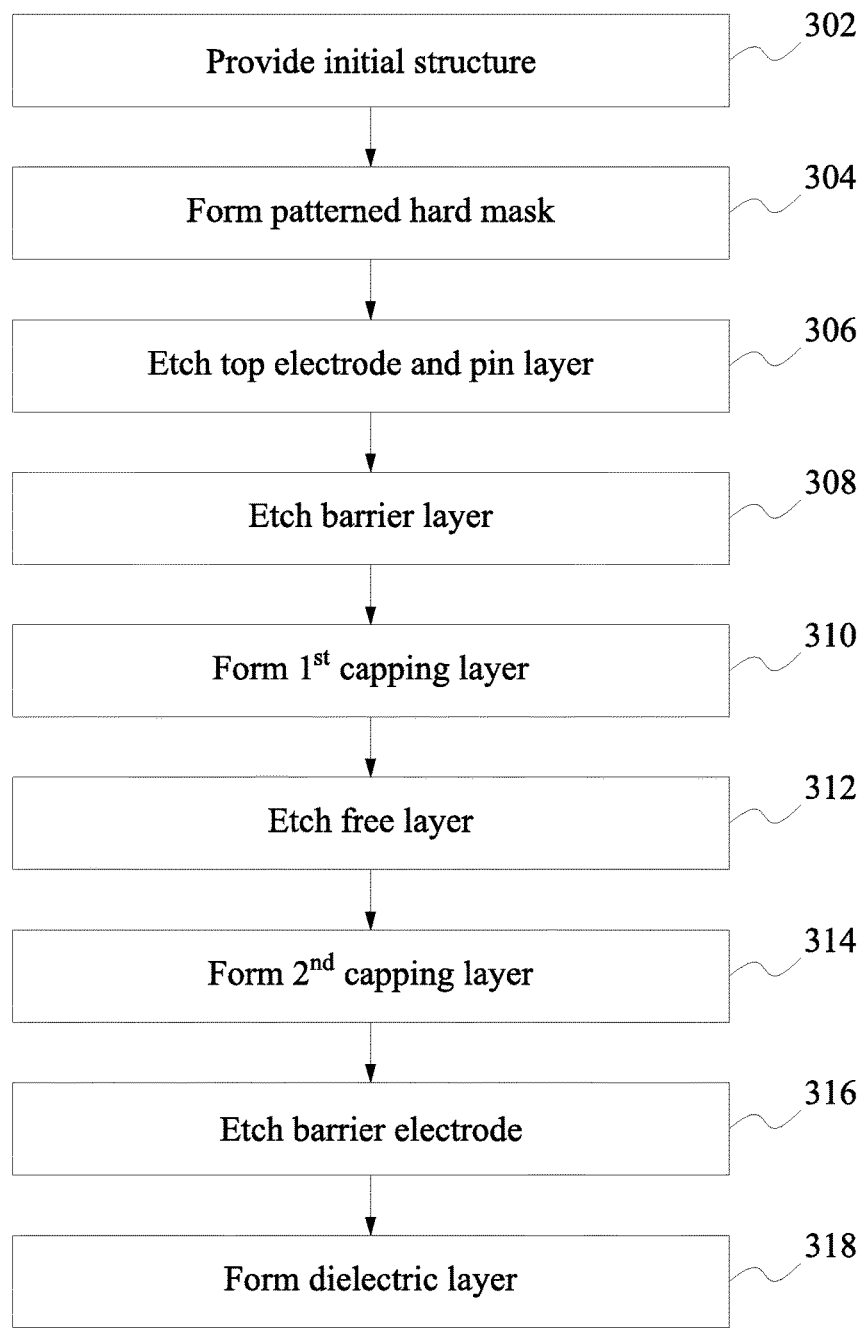
FIG. 3 is a flowchart of another example method for fabricating a MRAM cell constructed in accordance with some embodiments.

FIG. 3 is a flowchart of another method 300 of fabricating a MRAM cell 400. The MRAM cell 400 is similar to the cell 200. However, in comparison with the cell 200 that includes the barrier layer 230 disposed over the pin layer 220, the cell 400 includes a barrier layer disposed over a free layer.

The method 300 is discussed in detail below, with reference to the MRAM cell 400 showed in FIGS. 4A, 4B, 4C, 4D, 4E, 4F, 4G, 4H, 4I, and 4J. FIGS. 4A-4J illustrate sectional views of the MRAM cell 400 during various fabrication stages and constructed according to various aspects of the present disclosure in one or more embodiments.

The method 300 starts at operation 102 by providing an initial structure 405 of a MRAM cell 400 as shown in FIG. 4A. The initial structure 405 may include a bottom electrode layer 412 disposed over a substrate 410. The substrate 410 may include layers, features of an integrated circuit, such as an etch-stop layer and vias. The bottom electrode layer 412 may include titanium (Ti), tantalum (Ta), platinum (Pt), ruthenium (Ru), titanium nitride (TiN), tantalum nitride (TaN), and/or other suitable materials. In one embodiment, the bottom electrode layer 412 has a thickness ranging from about 10 nm to about 100 nm.

The initial structure 405 also includes a stack of films 406 over the bottom electrode layer 412. The stack of film 406 includes a free layer 420 disposed over the bottom electrode layer 412. The free layer 420 may include a ferromagnetic material but it is not pinned because there is no anti-ferromagnetic material adjacent to the free layer 420. Therefore, the magnetic orientation of the layer 420 is free, thus referred to as a free layer. The free layer 420 has a variable magnetic polarity representing a unit of data. For example, the variable magnetic polarity switches between a first state and a second state that respectively represent a binary "0" and a binary "1". The free layer 420 may include cobalt (Co), iron (Fe), boron cobalt-iron-boron (CoFeB), cobalt-iron-tantalum (CoFeTa), nickel iron (NiFe), cobalt iron (CoFe), cobalt platinum (CoPt), cobalt palladium (CoPd), iron platinum (FePt), and/or the alloy of Ni, Co and/or Fe. In one embodiment, the free layer 420 has a thickness ranging from about 1 nm to about 3 nm.

The stack of films 406 also includes a barrier layer 430 disposed over the free layer 420. The barrier layer 430 provides electrical isolation between the free layer 420 and a pin layer 440 to be formed over the barrier layer 430, while still allowing electrons to tunnel through under proper conditions. The material of the barrier layer 430 is also chosen in such that it has an adequate etching resistance in a subsequent etching which will be described details later. The barrier layer 430 may include a metal-oxide and/or metal-nitride layer. The metal in the metal-oxide (or metal-nitride) barrier layer includes magnesium (Mg), beryllium (Be), aluminium (Al), Ti, tungsten (W), germanium (Ge), Pt and/or their alloy. In one embodiment, the barrier layer 230 has a thickness ranging from about 0.5 nm to about 2 nm.

As illustrated in FIG. 4A, the pin layer 440 is disposed over the barrier layer 430. The pin layer 440 may include a ferromagnetic material such as Co, Fe, CoFeBRu, CoFeTa, CoFeB, NiFe, Co, CoFe, CoPt, CoPd, FePt, and/or the alloy of Ni, Co and/or Fe. In one embodiment, the pin layer 440 has a thickness ranging from about 5 nm to about 10 nm. Additionally or alternatively, the pin layer 440 may also include a multilayer structure. In the example where the pin layer 440 includes a multilayer structure, the pin layer 440 may include a first pinned layer (or bottom pin layer) and a second pinned layer (or top pin layer) interposed by a spacer layer.

In accordance with some illustrative embodiments, the stack of films 406 may also include a top electrode layer 450 disposed over the pin layer 440. The top electrode layer 450 may include titanium (Ti), tantalum (Ta), platinum (Pt), ruthenium (Ru), titanium nitride (TiN), tantalum nitride (TaN), and/or other suitable materials. In one embodiment, the top electrode layer 450 has a thickness ranging from about 10 nm to about 100 nm.

One or more of layers 412, 420, 430, 440, and 450 may be formed by various methods, including physical vapor deposition (PVD) process, a chemical vapor deposition (CVD) process, ion beam deposition, spin-on coating, metal-organic decomposition (MOD), atomic layer deposition (ALD), and/or other methods.

Referring to FIGS. 3 and 4B, after the initial structure 405 is provided, the method 300 proceeds to operation 304 by forming a patterned hard mask (HM) layer 460 over the top electrode layer 450. The patterned HM layer 460 defines (covers) a MTJ region 461 having a first width $W_1$. In one embodiment, the patterned HM 460 is a patterned photoresist layer formed by a procedure including coating, exposure, post exposure baking, and developing. In another embodiment, the patterned HM 460 is formed by depositing a HM layer over the top electrode layer 450, depositing photoresist layer over the HM layer, patterning the photoresist layer, then etching the HM layer through patterned photoresist layer to pattern the HM layer. The HM layer may include oxide, silicon nitride, and/or other suitable material, deposited by CVD, PVD, spin-on coating, and/or other suitable technique.

Figure 4D:
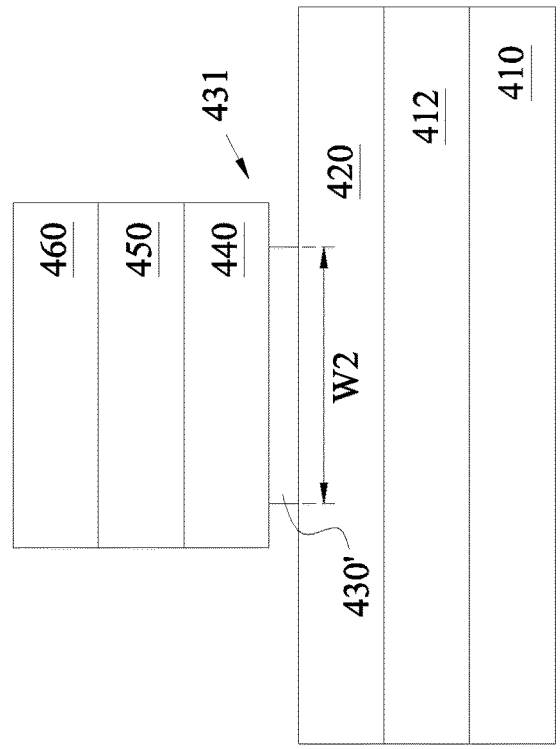
Figure 4C:
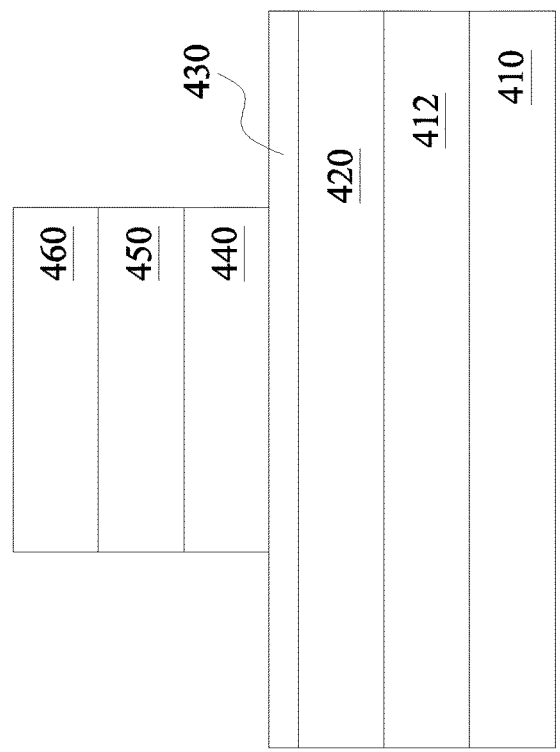

Referring to FIGS. 3 and 4C, the method 300 proceeds to operation 306 with performing a first etch process to etch the top electrode 450 and the pin layer 440 by using the patterned HM layer 460 as an etch mask. The first etch process may include a wet etch, a dry etch, and/or a combination thereof. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The first etch process may include a multiple-step etching to gain etch selectivity, flexibility and desired etch profile. As has been mentioned previously, the first etch process is chosen to selectively etch the top electrode layer 450 and the pin layer 440 without substantially etching the barrier layer 430. Thus, the barrier layer 430 may server as an etch-stop layer to alleviate etch process constraints and improve the etch process window. During the operation 306, a top surface of the portion of the barrier layer 430 not covered by the patterned HM 460 (i.e., the portion other than 461) is exposed.

Referring to FIGS. 1 and 4D, the method 100 proceeds to operation 308 with performing a second etch process 431 to etch the exposed portions of barrier layer 430 thereby forming an etched barrier layer 430' (or recessed barrier layer). As shown in FIG. 4D, a recess is formed respectively on left and right sides of the etched barrier layer 430'. The etched (remaining) barrier layer 430' has a width $W_2$, which is narrower than the width of the patterned HM 460, the pin layer 440, and the top electrode layer 450 (i.e., $W_1$). In accordance with the current embodiments, the width $W_2$ is about 90% the width $W_1$. More specifically, the recess formed on the left/right side of the etched barrier layer 430' may has a width about 5% the width of the patterned HM 460, the pin layer 440, and the top electrode layer 450 (i.e., $W_1$). The second etch process may include a wet etch, a dry etch, and/or a combination thereof. In the present embodiment, the second etch is an isotropic etch process. Moreover, the second etch process is chosen to selectively etch the barrier layer 430 without substantially etching the patterned HM 460, the pin layer 440, and the top electrode layer 450.

Similar to operation 110 with respect to FIG. 1, the second etch process occurring during operation 308 may be a plasma-assisted etch process. Such a plasma-assisted etching process may use methanol at flow rate of about 100 standard cubic centimeters per minute (sccm). More specifically, during the etch process, a source power of about 1500 Watt to about 2000 Watt may be used while no bias power is provided. By not applying any bias power, it advantageously causes the second etch process to be more isotropic and thus may etch the barrier layer 430 in a more controllable manner.

Figure 4F:
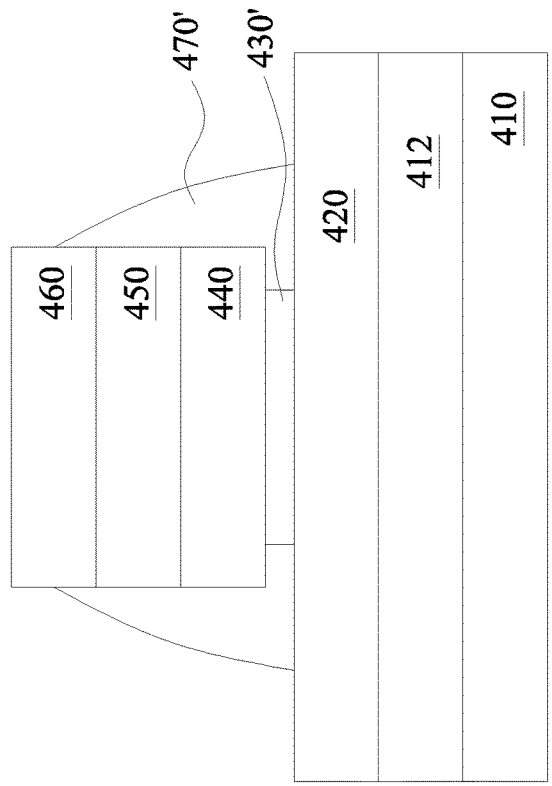
Figure 4E:
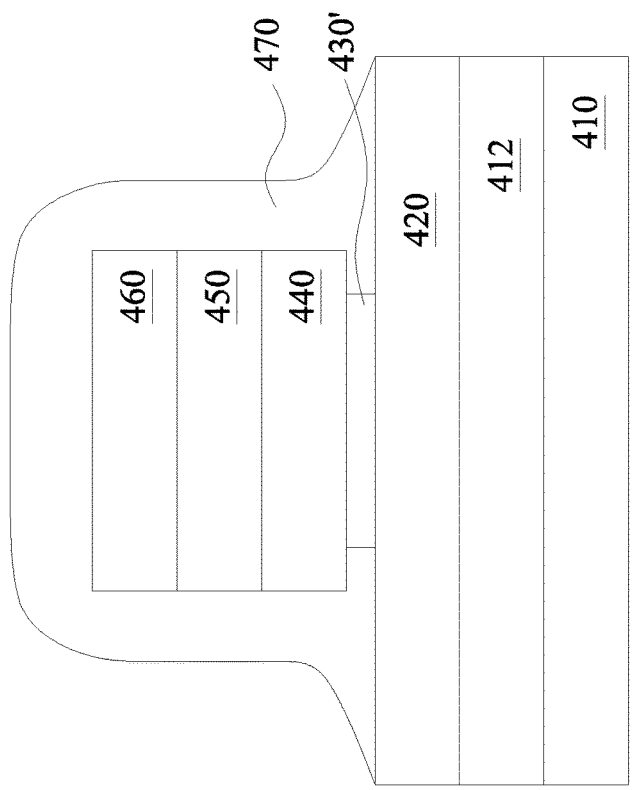

Referring to FIGS. 3 and 4E, the method 300 proceeds to operation 310 by forming a first capping layer 470 over the patterned HM layer 460, including conformably extending along sidewalls of the top electrode layer 450, the pin layer 440, and the etched barrier layer 430'. The first capping layer 470 may include silicon nitride, silicon carbide, and/or other suitable materials. The material of the first capping layer 470 is chosen in such that it has an adequate etching resistance in a subsequent etching as described below. The first capping layer 470 may be deposited by CVD, ALD, and/or other suitable process.

Referring to FIGS. 3 and 4F, during the operation 310 of method 300, a third etch process is performed to remove part of the first capping layer 470 to expose a top surface of the free layer 420 and to expose a top surface of the patterned HM 460. After the third etching, etched first capping layer 470' is formed and the etched first capping layer 470' remains along sidewalls of the top electrode layer 450, the pin layer 440, and the etched barrier layer 430'. In some alternative embodiments, the etched first capping layer 470' may extend to the sidewall of the patterned HM 460. In the present embodiment, the third etch process may include an anisotropic dry etch process, which etches the first capping layer 470 disposed over the top surface the free layer 420, but leaves the portion of the capping layer 470 along the sidewalls of the top electrode layer 450 and the pin layer 440. The third etch process may also include a selective anisotropic dry etch process, which is preferential of the first capping layer 470 relative to the patterned HM 460 and the free layer 420. In one embodiment, the third etch process includes a plasma dry etching process using a fluorine-based chemistry, such as $CF_4$, $SF_6$, $CH_2F_2$, $CHF_3$, and/or $C_2F_6$.

Figure 4H:
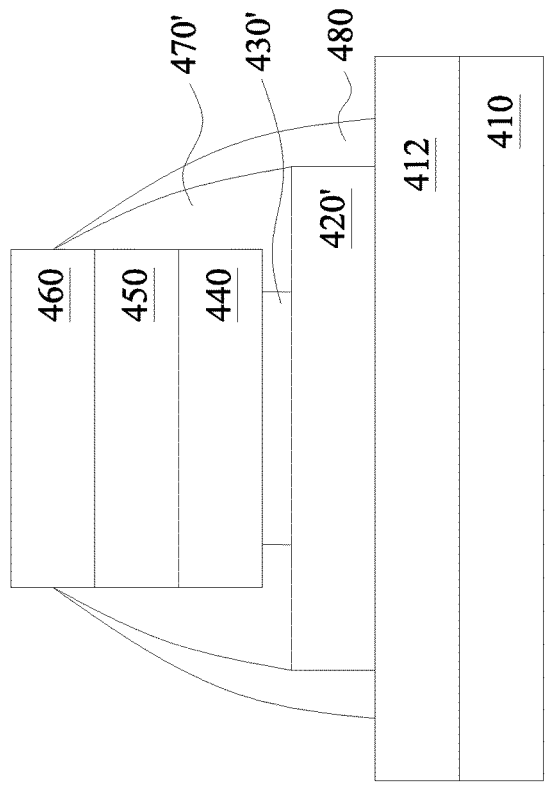
Figure 4G:
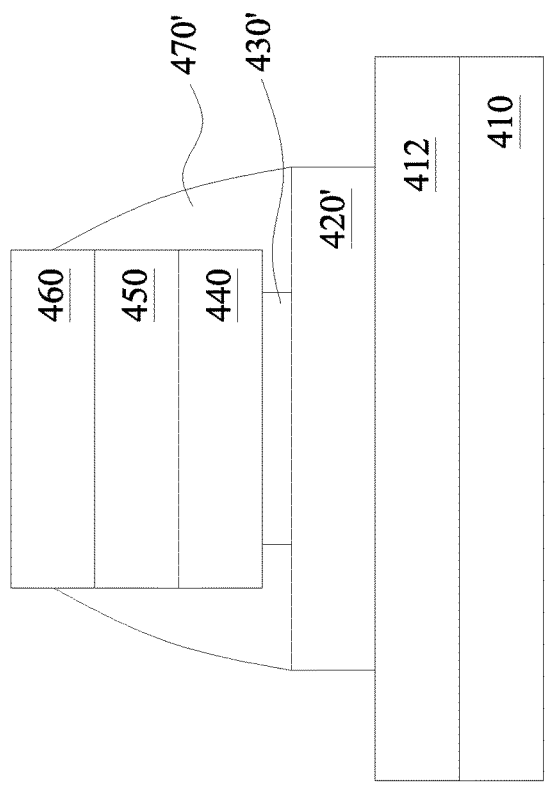

Referring to FIGS. 3 and 4G, the method 300 proceeds to operation 312 with performing a fourth etch process to etch the free layer 420 by using the etched first capping layer 470' as an etch mask. As illustrated in the embodiment of FIG. 4G, an etched free layer 420' is formed. The fourth etch process may include a wet etch, a dry etch, and/or a combination thereof. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The fourth etch process may include a multiple-step etching to gain etch selectivity, flexibility and desired etch profile. As has been mentioned previously, the fourth etch process is chosen to selectively etch the free layer 420 without substantially etching the etched first capping layer 470' and the bottom electrode layer 412. Thus, the bottom electrode layer 412 may serve as an etch-stop layer to alleviate etch process constraints and improve the etch process window. During the operation 312, a portion of the bottom electrode layer 412 not covered by the patterned HM 460 and the etched first capping layer 470' is exposed.

Referring to FIGS. 3 and 4H, the method 300 proceeds to operation 314 by forming a second capping layer 480 over the etched free layer 420', including conformably extending along the sidewalls of the top electrode layer 450, the pin layer 440, the etched barrier layer 430', and the etched free layer 420'. The second capping layer 480 is formed similarly in many respects with the first capping layer 470/470' discussed above with respect to FIGS. 4E and 4F. In that regard, second capping layer 480 may be formed of the same materials or different materials than first capping layer 470/470'.

Figure 4J:
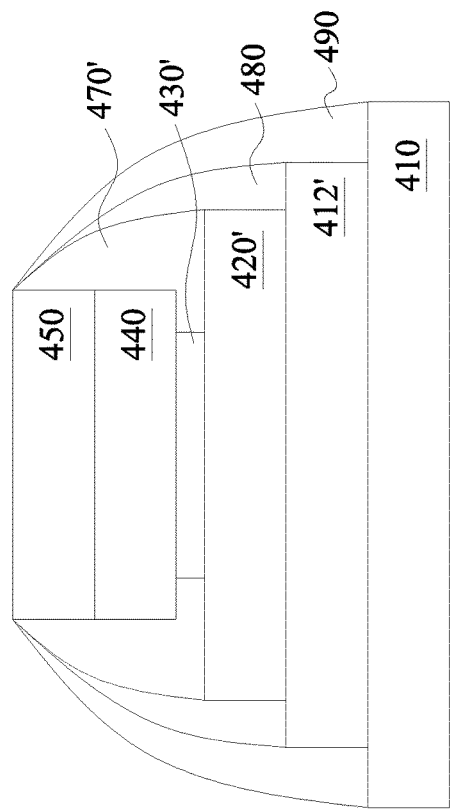
Figure 4I:
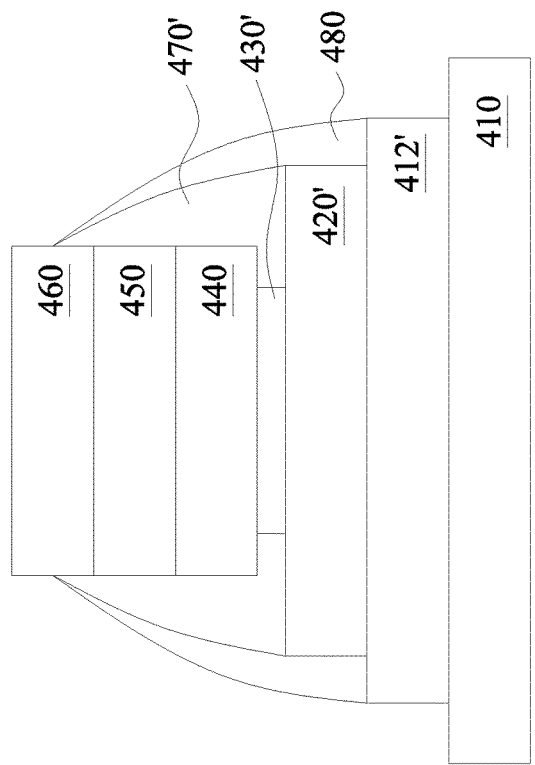

Referring to FIGS. 3 and 4I, the method 300 proceeds to operation 316 by etching the bottom electrode layer 412 by using the second capping layer 480 as an etch mask. As shown in the illustrated embodiment of FIG. 4I, an etched bottom electrode layer 412' is formed. Since the second capping layer 480 is used as the etch mask and the etched bottom electrode layer 410' is formed according to the etch mask without a further pattering process, the operation may be referred to as a "self-aligning" process.

Referring to FIGS. 3 and 4J, the method 300 proceeds to operation 318 by forming a dielectric layer 490 over the second capping layer 480 and filling up spaces around the MTJ region. In some embodiments, the dielectric layer 490 may be an inter-metal dielectric layer and/or an inter-layer dielectric layer. Such an dielectric layer 490 may include silicon oxide, silicon nitride, a dielectric material layer having a dielectric constant (k) lower than thermal silicon oxide (therefore referred to as low-k dielectric material layer), and/or other suitable dielectric material layer. The dielectric layer 490 may be deposited by CVD, spin-on coating, and/or other suitable process. In some specific embodiments, the forming the dielectric layer 490 may further include performing a chemical mechanical polishing/planarization (CMP) process thereby removing the patterned HM 460.

Conventionally, to manufacture an MRAM cell, a free layer, a barrier layer, and a pin layer are stacked in an order over a bottom electrode layer. One or more plasma etches is then performed down to the bottom electrode layer through regions of the pin layer, the barrier layer and the free layer surrounding an MTJ region of the stack. By performing such etch processes, conventionally one or more of these layers experiences process-induced adverse effects, such as plasma damage, and/or by-products (such as polymer) re-deposition, which leads to increased leakage current and/or reduced data retention. However, according to the current embodiments, such adverse effects are avoided. In an example, by using the isotropic etch process (i.e., the operations 110 and 308) to form recess(es) beside a barrier layer, the above-identified by-products (e.g., polymer, sputter metal particles) may not be re-deposited along the sidewall of the barrier layer. As such, leakage current through the barrier layer may be eliminated. In another example, by forming the first capping layer (i.e., the operations 108 and 310) over the etched free layer (e.g., 240) or the etched pin layer (e.g., 440), even though the etched free layer (e.g., 240) or the etched pin layer (e.g., 440) may be exposed to re-deposited by-products (e.g., sputter metal particles) during an etch process, the first capping layer may be configured to passivate/cover the re-deposited by-products along the sidewalls of the etched free layer or the etched pin layer. Accordingly, the above-identified adverse effects may be advantageously circumvented.

The present disclosure provides many different embodiments of fabricating a semiconductor device that provide one or more improvements over existing approaches. In one embodiment, a method for fabricating a semiconductor device includes forming a stack of film disposed over a bottom electrode layer, wherein the stack of film includes a pin layer disposed over the bottom electrode layer, a barrier layer disposed over the pin layer, a free layer disposed over the barrier layer, and a top electrode layer disposed over the free layer; forming a patterned hard mask over the top electrode layer; etching the top electrode layer and the free layer by using the patterned hard mask as a first etch mask; forming a first capping layer along sidewalls of the top electrode layer and the free layer; etching the barrier layer thereby forming a recessed barrier layer that is located between the first capping layer and the pin layer; forming a second capping layer over the first capping layer and extending along sidewalls of the recessed barrier layer; and etching the pin layer and the bottom electrode layer by using the second capping layer as a second etch mask.

In yet another embodiment, a method includes forming a stack of film disposed over a bottom electrode layer, wherein the stack of film includes a free layer disposed over the bottom electrode layer, a barrier layer disposed over the free layer, a pin layer disposed over the barrier layer, and a top electrode layer disposed over the pin layer; forming a patterned hard mask over the top electrode layer; etching the top electrode layer and the pin layer by using the patterned hard mask as a first etch mask; etching the barrier layer thereby forming a recess located between the free layer and the pin layer; forming a first capping layer along sidewalls of the top electrode layer, the pin layer, and the etched barrier layer; etching the free layer by using the first capping layer as a second etch mask; forming a second capping layer over the first capping layer and extending along a sidewall of the etched free layer; and etching the bottom electrode layer by using the second capping layer as a third etch mask.

In yet another embodiment, a magnetoresistive random-access memory (MRAM) cell includes a free layer having a variable magnetic polarity, wherein the free layer has a first width; a pin layer having a fixed magnetic polarity, wherein the pin layer has the first width; a barrier layer located between the pin layer and the free layer, wherein the barrier layer has a second width that is less than the first width; a top electrode layer located above the free layer, the pin layer, and the barrier layer; a bottom electrode layer located beneath the free layer, the pin layer, and the barrier layer; and a capping layer encapsulating a sidewall of the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a stack of film disposed over a bottom electrode layer, wherein the stack of film includes a pin layer disposed over the bottom electrode layer, a barrier layer disposed over the pin layer, a free layer disposed over the barrier layer, and a top electrode layer disposed over the free layer;
    forming a patterned hard mask over the top electrode layer;
    etching the top electrode layer and the free layer by using the patterned hard mask as a first etch mask;
    forming a first capping layer along sidewalls of the top electrode layer and the free layer;
    etching the barrier layer thereby forming a recessed barrier layer that is located between the first capping layer and the pin layer;
    forming a second capping layer over the first capping layer and extending along sidewalls of the recessed barrier layer; and
    etching the pin layer and the bottom electrode layer by using the second capping layer as a second etch mask.

2. The method of claim 1, further comprising forming an inter-metal dielectric layer over the patterned hard mask and along sidewalls of the second capping layer, the pin layer, and the bottom electrode layer.

3. The method of claim 1, wherein the barrier layer serves as an etch-stop layer during etching of the top electrode layer and the free layer.

4. The method of claim 1, wherein forming the first capping layer along sidewalls of the top electrode layer and the free layer includes:
    depositing the first capping layer over the patterned hard mask, along sidewalls of the top electrode layer and the free layer, and over a top surface of the barrier layer; and
    removing the first capping layer over the patterned hard mask to expose a portion of the patterned hard mask.

5. The method of claim 1, wherein etching the barrier layer thereby forming the recessed barrier layer includes using a plasma-assisted etching process.

6. The method of claim 5, wherein etching the barrier layer thereby forming the recessed barrier layer includes using methanol during the etching.

7. The method of claim 5, wherein etching the barrier layer thereby forming the recessed barrier layer includes etching the barrier layer without a direct-current (DC) bias.

8. The method of claim 1, wherein etching the barrier layer thereby forming a recessed barrier layer includes forming recesses on either side of the recessed barrier layer, and
    wherein forming the second capping layer over the first capping layer and extending along sidewalls of the recessed barrier layer includes forming the second capping layer in the recesses on either side of the recessed barrier layer.

9. A method comprising:
    forming a stack of film disposed over a bottom electrode layer, wherein the stack of film includes a free layer disposed over the bottom electrode layer, a barrier layer disposed over the free layer, a pin layer disposed over the barrier layer, and a top electrode layer disposed over the pin layer;
    forming a patterned hard mask over the top electrode layer;
    etching the top electrode layer and the pin layer by using the patterned hard mask as a first etch mask;
    etching the barrier layer thereby forming a recess located between the free layer and the pin layer;
    forming a first capping layer along sidewalls of the top electrode layer, the pin layer, and the etched barrier layer;
    etching the free layer by using the first capping layer as a second etch mask;
    forming a second capping layer over the first capping layer and extending along a sidewall of the etched free layer; and
    etching the bottom electrode layer by using the second capping layer as a third etch mask.

10. The method of claim 9, further comprising forming an inter-metal dielectric layer over the patterned hard mask and along sidewalls of the second capping layer and the bottom electrode layer.

11. The method of claim 9, wherein the free layer serves as an etch-stop layer during the etching the top electrode layer, the pin layer, and the barrier layer.

12. The method of claim 9, wherein forming the first capping layer along sidewalls of the top electrode layer, the pin layer, and the etched barrier layer includes:
    depositing the first capping layer over the patterned hard mask, along sidewalls of the top electrode layer, the pin layer, and the etched barrier layer, and over a top surface of the free layer; and
    removing the first capping layer over the patterned hard mask to expose a portion of the patterned hard mask.

13. The method of claim 9, wherein the etching the barrier layer includes using a plasma-assisted etching process.

14. The method of claim 13, wherein etching the barrier layer includes using methanol during the etching.

15. The method of claim 13, wherein etching the barrier layer includes etching the barrier layer without a direct-current (DC) bias.

16. The method of claim 9, wherein forming the first capping layer along sidewalls of the top electrode layer, the pin layer, and the etched barrier layer sidewalls includes forming the first capping layer in the recess located between the free layer and the pin layer.

17. The method of claim 9, wherein the first capping layer and the second capping layer are formed of different materials.

18. A magnetoresistive random-access memory (MRAM) cell comprising:
    a free layer having a variable magnetic polarity, wherein the free layer has a first width;
    a pin layer having a fixed magnetic polarity, wherein the pin layer has a third width that is different than the first width;
    a barrier layer located between the pin layer and the free layer, wherein the barrier layer has a second width that is less than the first width;
    a top electrode layer located above the free layer, the pin layer, and the barrier layer;
    a bottom electrode layer located beneath the free layer, the pin layer, and the barrier layer; and
    a capping layer encapsulating a sidewall of the barrier layer.

19. The MRAM cell of claim 18, wherein the barrier layer is disposed over the free layer and below the pin layer, and wherein the capping layer is disposed along sidewalls of the top electrode layer, the pin layer, the barrier layer, and the free layer.

20. The MRAM cell of claim 18, wherein the barrier layer is disposed over the pin layer and below the free layer, and wherein the capping layer is disposed along sidewalls of the top electrode layer, the free layer, the barrier layer, and a top surface of the pin layer.

* * * * *